US012276892B2

(12) United States Patent
Li et al.

(10) Patent No.: US 12,276,892 B2
(45) Date of Patent: Apr. 15, 2025

(54) ARRAY SUBSTRATE AND DISPLAY PANEL

(71) Applicant: HKC CORPORATION LIMITED, Shenzhen (CN)

(72) Inventors: Yao Li, Shenzhen (CN); Chuan Wu, Shenzhen (CN); Zhonglin Cao, Shenzhen (CN); Lidan Ye, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/641,365

(22) Filed: Apr. 20, 2024

(65) Prior Publication Data
US 2024/0361654 A1    Oct. 31, 2024

(30) Foreign Application Priority Data
Apr. 27, 2023 (CN) .......................... 202310480411.4

(51) Int. Cl.
G02F 1/1362 (2006.01)
G02F 1/1343 (2006.01)
G02F 1/1368 (2006.01)
H10D 86/40 (2025.01)
H10D 86/60 (2025.01)

(52) U.S. Cl.
CPC .. G02F 1/136286 (2013.01); G02F 1/134309 (2013.01); G02F 1/1368 (2013.01); H10D 86/441 (2025.01); H10D 86/60 (2025.01)

(58) Field of Classification Search
CPC ............ G02F 1/1362; G02F 1/136286; G02F 1/134309; G02F 1/1368; G02F 1/13624; H10D 86/441; H10D 86/60
See application file for complete search history.

(56) References Cited

U.S. PATENT DOCUMENTS

| 5,745,207 | A | * | 4/1998 | Asada | G02F 1/134363 349/178 |
| 6,091,473 | A | * | 7/2000 | Hebiguchi | G02F 1/134363 349/138 |
| 2005/0110930 | A1 | * | 5/2005 | Kim | G02F 1/134363 349/141 |

(Continued)

FOREIGN PATENT DOCUMENTS

| CN | 101666948 | * | 1/2001 | .......... G02F 1/1362 |
| CN | 1621924 A | | 6/2005 | |

(Continued)

Primary Examiner — Charles S Chang

(57) ABSTRACT

Some embodiments of the present disclosure provide an array substrate and a display pane. Multiple pixel electrode branches in a corresponding one of the pixel regions are divided into a first pixel electrode branch and a second pixel electrode branch by a corresponding one of the metal common electrodes. The first pixel electrode branch and the second pixel electrode branch, which are located in the same pixel regions, are connected to different TFTs. In each pixel region, an end of the first pixel electrode branch close to a corresponding one of the scan lines is connected to a corresponding one of the TFTs, and an end of the second pixel electrode branch close to another corresponding one of the scan lines is connected to another corresponding one of the TFTs.

20 Claims, 5 Drawing Sheets

(56) References Cited

U.S. PATENT DOCUMENTS

| | | | | |
|---|---|---|---|---|
| 2005/0128413 A1* | 6/2005 | Son | ................... | G02F 1/134363 |
| | | | | 349/143 |
| 2008/0068539 A1* | 3/2008 | Kaneko | ............. | G02F 1/134363 |
| | | | | 349/106 |
| 2018/0217706 A1* | 8/2018 | Huang | ................ | G06F 3/04184 |

FOREIGN PATENT DOCUMENTS

| | | | | |
|---|---|---|---|---|
| CN | 100340912 C | | 10/2007 | |
| WO | WO 2006085529 | * | 8/2006 | ........... G02F 1/1362 |

* cited by examiner

ARRAY SUBSTRATE AND DISPLAY PANEL

CROSS REFERENCE TO RELATED APPLICATIONS

The present application claims priority to Chinese Patent Application No. 202310480411.4 filed on Apr. 27, 2023, the content of which is herein incorporated by reference in its entirety.

TECHNICAL FIELD

Embodiments of the present disclosure relate to the field of display technology, and in particular to an array substrate and a display panel.

BACKGROUND

The display principle of liquid crystal display screens is as follow. Under external electric fields, arrangement directions of liquid crystal molecules will change to different degrees, such that different grayscale brightness may be controlled by controlling the amount of light passing through the liquid crystal. Generally, when an external electric field has a certain intensity, an orientation change of liquid crystal molecules will be occurred. The orientation change of liquid crystal molecules is called a fredericksz transition. By utilizing the fredericksz transformation principle, different liquid crystals may exhibit various display modes. The commonly-used display modes of liquid crystal display screens include TN (twisted nematic) display mode, IPS (in plane switching display) mode, and VA (vertical alignment display) mode.

The FFS (Fringe Field Switching) is a deformation technology of the IPS, and the FFS is a type of wide-angle display modes. The FFS is widely promoted and used in various panel factories due to its better viewing angle, color display, and higher transmittance. Generally, in a drive back plate, a pixel electrode and a common electrode are located in a pixel opening area, and two electrodes need to use transparent ITO (Indium tin oxide) materials to allow the backlight to transmit therethrough.

When large-size products have large pixels, a length of ITO slit in the longitudinal direction will also be large. Voltages at a far end of the ITO slit will attenuate relative to voltages at a near end of the ITO slit because the resistance of ITO materials is large. As a result, differences may be generated between the electric field at the near end and the electric field at the far end of the pixel ITO. Pressure differences will affect the deflection of the liquid crystals, such that the display brightness at the near end and the display brightness at the far end of the same pixel are different from each other.

SUMMARY OF THE DISCLOSURE

Some embodiments of the present disclosure provide an array substrate and a display panel.

One technical solution adopted by some embodiments of the present disclosure is to provide an array substrate, and the array substrate includes a first substrate, a first metal layer, a second metal layer, and a first transparent conductive layer. The first metal layer, the second metal layer, and the first transparent conductive layer are arranged on one side of the first substrate sequentially. The first metal layer is configured to form metal common electrodes and scan lines. The second metal layer is configured to form data lines. The first transparent conductive layer is configured to form a common electrode layer. The data lines are crossed with the scan lines to define a plurality of pixel regions. Each of the plurality of pixel regions includes a pixel. The array substrate further includes a second transparent conductive layer, and the second transparent conductive layer is configured to form a pixel common electrode of the pixel. The pixel common electrode includes a plurality of pixel electrode branches, and each of the plurality of pixel electrode branches extends along an extension direction of a corresponding one of the data lines. Each metal common electrode is arranged between two adjacent of the scan lines. The plurality of pixel electrode branches in a corresponding one of the pixel regions are divided into a first pixel electrode branch and a second pixel electrode branch insulated from the first pixel electrode branch by the metal common electrode, and the first pixel electrode branch and the second pixel electrode branch, which are located in the same pixel region, are connected to different TFTs (thin film transistors).

Another technical solution adopted by some embodiments of the present disclosure is to provide a display panel. The display panel includes an array substrates, a color film substrate, and a liquid crystal layer. The array substrate includes a first substrate, a first metal layer, a second metal layer, and a first transparent conductive layer. The first metal layer, the second metal layer, and the first transparent conductive layer are arranged on one side of the first substrate sequentially. The first metal layer is configured to form metal common electrodes and scan lines. The second metal layer is configured to form data lines. The first transparent conductive layer is configured to form a common electrode layer. The data lines are crossed with the scan lines to define a plurality of pixel regions. Each of the plurality of pixel regions includes a pixel. The array substrate further includes a second transparent conductive layer, and the second transparent conductive layer is configured to form a pixel common electrode of the pixel. The pixel common electrode includes a plurality of pixel electrode branches, and each of the plurality of pixel electrode branches extends along an extension direction of a corresponding one of the data lines. Each metal common electrode is arranged between two adjacent of the scan lines. The plurality of pixel electrode branches in a corresponding one of the pixel regions are divided into a first pixel electrode branch and a second pixel electrode branch insulated from the first pixel electrode branch by the metal common electrode, and the first pixel electrode branch and the second pixel electrode branch, which are located in the same pixel region, are connected to different TFTs. The color film substrate is arranged opposite to the array substrate. A liquid crystal layer is arranged between the array substrate and the color film substrate.

BRIEF DESCRIPTION OF THE DRAWINGS

In order to illustrate more clearly the technical solutions in the embodiments of the present disclosure, drawings for describing the embodiments will be described briefly in the following. Apparently, the described drawings show only some of the embodiments of the present disclosure, any ordinary skilled person in the art shall obtain other drawings without any creative work.

REFERENCE NUMERALS IN DRAWINGS

Figure 1:
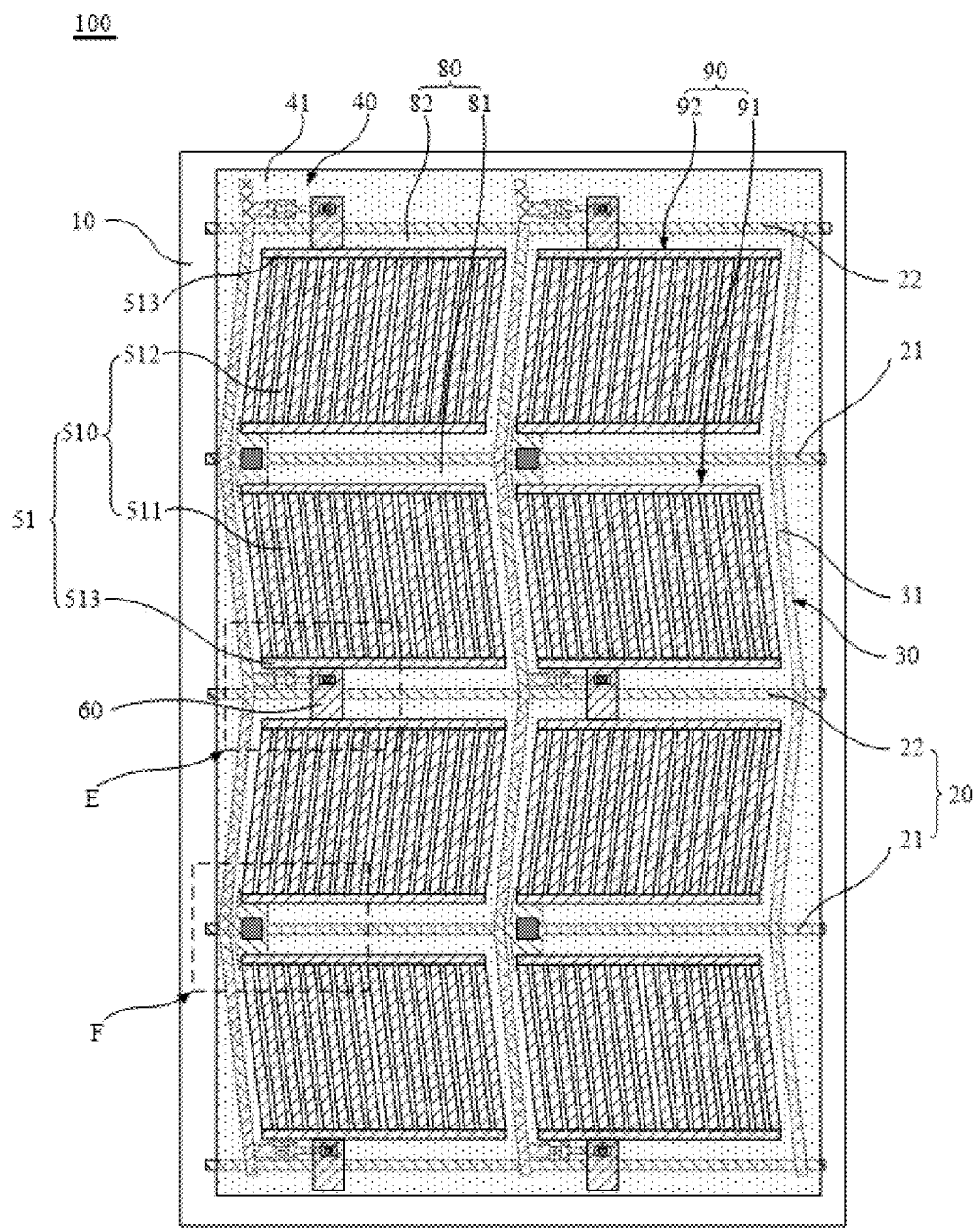
FIG. 1 is a structural schematic view of an array substrate according to a first embodiment of the present disclosure.

100—Array substrate, 10—first substrate, 20—first metal layer, 21—metal common electrode, 22—scan lines, 30—second metal layer, 31—data lines, 40—first Transparent conductive layer, 41—common electrode layer, 50—second transparent conductive layer, 51—pixel common electrode, 510—pixel electrode branch, 511—first pixel electrode branch, 512—second pixel electrode branch, 513—pixel electrode stem, 60—bridging portion, 61—first via hole, 62—second via hole, 63—third via hole, 70—TFTs, 71—gate, 72—source, 73—drain, 731—first drain, 732—second drain, 74—semiconductor layer, 80—pixel regions, 81—first area, 82—second area, 90—pixel, 91—first sub-pixel, 92—second sub-pixel, 200—color film substrate, 201—second substrate, 202—color resistance layer, 2021—color resistance, 2022—first color resistance, 2023—the second color resistances, 203—the light shielding layer, 300—the liquid crystal layer, 400—the display panel.

DETAILED DESCRIPTION

The technical solutions in the embodiments of the present disclosure will be described in detail in conjunction with the accompanying drawings of the present disclosure.

In the following description, specific details such as particular system structures, interfaces, techniques, and the like are presented for the purpose of illustration and not for the purpose of limitation, in order to provide a thorough understanding of the present application.

Technical solutions in the embodiments of the present disclosure will be clearly and completely described below by referring to the accompanying drawings in the embodiments of the present disclosure. Obviously, the described embodiments are only some of but not all of the embodiments of the present disclosure. Based on the embodiments in the present disclosure, all other embodiments obtained by any ordinary skilled person in the art without making creative work shall fall within the scope of the present disclosure.

Terms "first", "second" and "third" herein are used for descriptive purposes only and shall not be interpreted as indicating or implying relative importance or implicitly specifying the number of indicated technical features. Therefore, a feature defined by the "first", "second", or "third" may explicitly or implicitly include at least one such feature. In the present disclosure, "A and/or B" indicates including A only, or including B only, or including both A and B. In the description of the present disclosure, "a plurality of" means at least two, such as two, three, and so on, unless otherwise expressly and specifically limited. All directional indications in the present disclosure (such as up, down, left, right, front, rear, . . . ) are used only to explain relative position relationship, movement, and the like, between components at a particular posture (as shown in the drawings). When the posture is changed, the directional indications may change accordingly. In addition, terms "include" and "have" and any variations thereof are intended to cover non-exclusive inclusion. For example, a process, a method, a system, a product, or an apparatus including a series of operations or units is not limited to the listed operations or units, but may further include operations or units that are not listed, or include other operations or units that are inherent to the process, the method, the product, or the apparatus.

The "embodiments" of the present disclosure may mean that a particular feature, structure, or property described in an embodiment may be included in at least one embodiment of the present disclosure. Presence of the phrase at various sections in the specification does not necessarily mean a same embodiment, nor is it a separate embodiment or an alternative embodiment that is mutually exclusive with other embodiments. Any ordinary skilled person in the art shall explicitly or implicitly understand that the embodiments described herein may be combined with other embodiments.

Figure 2:
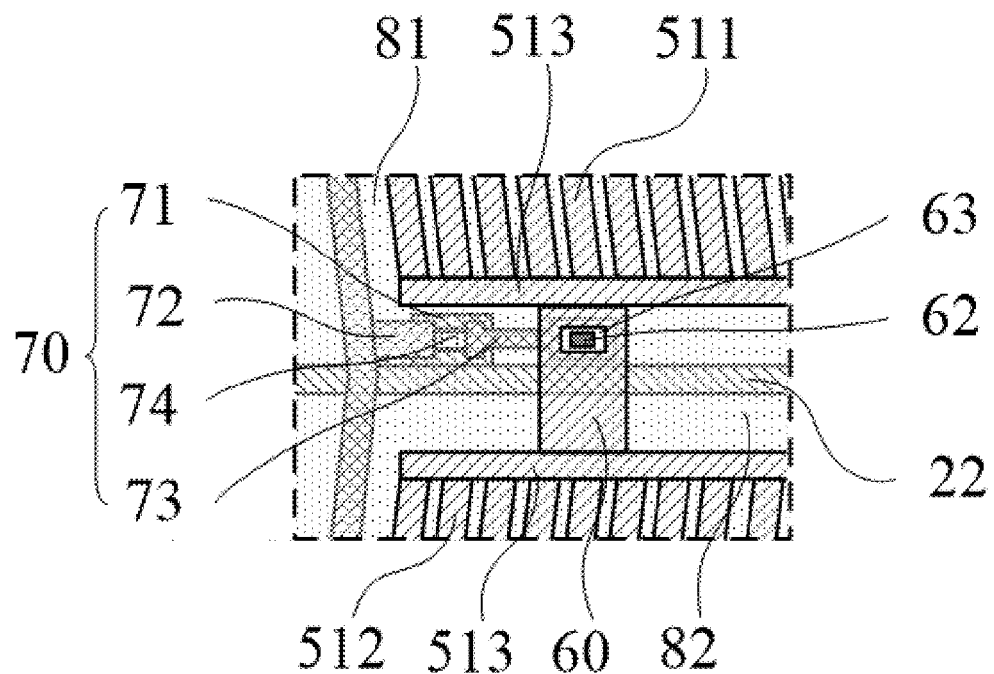
FIG. 2 is an enlarged structural schematic view of an area E circumscribed in FIG. 1 according to some embodiments of the present disclosure.
Figure 3:
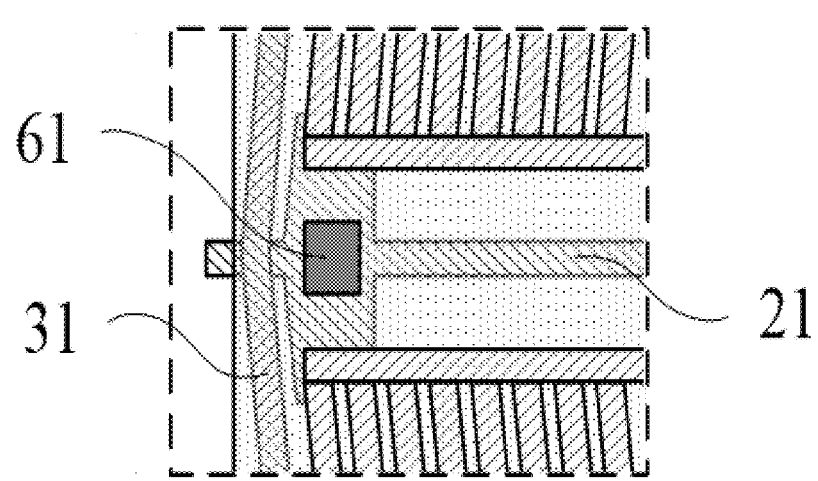
FIG. 3 is an enlarged structural schematic view of an area F circumscribed in FIG. 1 according to some embodiments of the present disclosure.

As shown in FIG. 1, FIG. 2 and FIG. 3, FIG. 1 is a structural schematic view of an array substrate according to a first embodiment of the present disclosure, FIG. 2 is an enlarged structural schematic view of an area E circumscribed in FIG. 1 according to some embodiments of the present disclosure, and FIG. 3 is an enlarged structural schematic view of an area F circumscribed in FIG. 1 according to some embodiments of the present disclosure.

Some embodiments of the present disclosure provide an array substrate 100. The array substrate 100 includes a first substrate 10, a first metal layer 20, a second metal layer 30, a first transparent conductive layer 40, and a second transparent conductive layer 50. The first metal layer 20, the second metal layer 30, and the first transparent conductive layer 40 are sequentially arranged on one side of the first substrate 10.

The first metal layer 20 is configured to form metal common electrodes 21 and scan lines 22. The second metal layer 30 is configured to form data lines 31. The first transparent conductive layer 40 is configured to form a common electrode layer 41. The data lines 31 are crossed with the scan lines 22 to define a plurality of pixel regions 80, and each of the plurality of pixel regions includes one pixel 90. The second transparent conductive layer 50 is configured to form a pixel common electrode 51 of the pixel 90. The first metal layer 20 is further configured to form to a gate 71 of each TFT (thin film transistor) 70. The second metal layer 30 is further configured to form to a source 72 of each TFT 70 and a drain 73 of each TFT 70.

The first transparent conductive layer 40 and the second transparent conductive layer 50 may include or be made of a tin oxide. It should be understood that the first transparent conductive layer 40 and the second transparent conductive layer 50 may also be made of another transparent conductive material.

It should be noted that, in some embodiments of the present disclosure, one pixel 90 corresponds to one color. For example, the one pixel 90 may be one blue pixel, one red pixel, one green pixel, or one pixel 90 of another color.

The pixel common electrode 51 includes a plurality of pixel electrode branches 510, and each of the plurality of pixel electrode branches 510 is arranged along an extension direction of a corresponding one of the data lines 31.

It should be noted that, each of the plurality of pixel electrode branches 510 extends along the extension direction of the corresponding one of the data lines 31. It means that an orientation of each of two opposite ends of each of the plurality of pixel electrode branches 510 is the same as an orientation of a corresponding one of two opposite ends of each of the data lines 31. It does not mean that the plurality of pixel electrode branches 510 must be parallel to the data lines 31.

Each metal common electrode 21 is arranged between two adjacent of the scan lines 22. The plurality of pixel electrode branches 510 in a corresponding one of the plurality of pixel regions 80 are divided into a first pixel electrode branch 511 and a second pixel electrode branch 512 by a corresponding one of the metal common electrodes 21. The first pixel electrode branch 511 and the second pixel electrode branch 512 are insulated from each other. The first pixel electrode branch 511 and the second pixel electrode branch 512, which are located in the same pixel region 80, are connected to different TFTs 70. That is, each metal common electrode 21 is located in the corresponding one of the plurality of pixel regions 80, and is located between the first pixel electrode branch 511 and the second pixel electrode branch 512 which are in the same pixel region 80. It can be understood that each of the plurality of pixel regions 80 is divided into a first area 81 and a second area 82 by the corresponding one of the metal common electrodes 21. The first pixel electrode branch 511 is located in the first area 81, and the second pixel electrode branch 512 is located in the second area 82. In each of the plurality of pixel regions 80, the corresponding one of the metal common electrodes 21 is located at a gap between the first area 81 and the second area 82. It may also be understood that the pixel 90 in each of the plurality of pixel regions 80 is divided into a first sub-pixel 91 and a second sub-pixel 92 by the corresponding one of the metal common electrodes 21. The first sub-pixel 91 and the second sub-pixel 92 are spaced apart from each other. The first sub-pixel 91 is located in the first region 81, and the second sub-pixel 92 is located in the second region 82.

In the extension direction of each of the data lines 31, the first pixel electrode branch 511 and the second pixel electrode branch 512, which are located in different pixel regions 80 and which are adjacent to each other, are connected to the same TFT 70. The first pixel electrode branch 511 and the second pixel electrode branch 512, which are located in the same pixel region 80, are connected to different TFTs 70. In each of the plurality of pixel regions 80, an end of the first pixel electrode branch 511 close to or adjacent to a corresponding one of the scan lines 22 is connected to a corresponding one of the TFTs 70, and an end of the second pixel electrode branch 512 close to or adjacent to another corresponding one of the scan lines 22 is connected to another corresponding one of the TFTs 70. That is to say, the first pixel electrode branch 511 and the second pixel electrode branch 512, which are located in the same pixel region 80, are connected to different TFTs 70. An electrical signal transmitting through the corresponding one of the TFTs 70 is conducted or transmitted from the end of the first pixel electrode branch 511 close to the corresponding one of the scan lines 22 to an end of the first pixel electrode branch 511 away from the corresponding one of the scan lines 22. An electrical signal transmitting through the another corresponding one of the TFTs 70 is conducted or transmitted from the end of the second pixel electrode branch 512 close to the another corresponding one of the scan lines 22 to an end of the second pixel electrode branch 512 away from the another corresponding one of the scan lines 22. Thus, in each of the plurality of pixel regions 80, a transmission direction of the electric signal in the first pixel electrode branch 511 is opposite to that in the second pixel electrode branch 512, and the transmission path of the electric signal on the plurality of pixel electrode branches 510 is effectively shortened, thereby reducing the attenuation of the electric signal on the plurality of pixel electrode branches 510 and improving the uniformity of the display brightness of the pixel 90.

In the extension direction of each of the data lines 31, a color of the pixel 90 in one of the pixel regions 80 is the same as a color of the pixel 90 in an adjacent one of the pixel regions 80. In other words, the extension direction of each of the data lines 31 is defined as a column direction, and the colors of the pixels 90 in the pixel regions 80 in each column are the same, such that the first pixel electrode branch 511 and the second pixel electrode branch 512, which are connected to the same TFT 70, may form one new pixel 90. In this way, the subsequent preparation process of a color resistance layer (not shown in FIG. 1) in the color film substrate (not shown in FIG. 1) will be simplified and the normal display of the display panel (not shown in FIG. 1) will not be affected.

In some embodiments, in the extension direction of each of the data lines 31, the first pixel electrode branch 511 and the second pixel electrode branch 512, which are located in different pixel regions 80 and which are adjacent to each other, step across the corresponding one of the scan lines 22 and are electrically connected to each other.

In some embodiments, the array substrate 100 further includes a bridging portion 60. The bridging portion 60 is configured to electrically connect the first pixel electrode branch 511 and the second pixel electrode branch 512, which are located in different pixel regions 80 and which are adjacent to each other in the extension direction of a corresponding one of the data lines 31. The bridging portion 60 is partially overlapped with the corresponding one of the scan lines 22 in a direction substantially perpendicular to the first substrate 10, and the bridging portion 60 is connected to the corresponding one of the TFTs 70. Each TFT 70 may have one drain 73, and the bridging portion 60 is connected to the drain 73. That is, the first pixel electrode branch 511 and the second pixel electrode branch 512, which are located in different pixel regions 80 and which are adjacent to each other in the extension direction of the corresponding one of the data lines 31, are respectively connected to the drain 73 of the corresponding one of the TFTs 70 through the bridging portion 60.

It should be understood that in other embodiments, either of the first pixel electrode branch 511 and the second pixel electrode branch 512, which are located in different pixel regions 80 and which are adjacent to each other in the extension direction of the corresponding one of the data lines 31, may be connected to the drain 73 of the corresponding one of the TFTs 70 through a via hole. That is, the bridging portion 60 is configured to conduct the first pixel electrode branch 511 and the second pixel electrode branch 512 or electrically connect the first pixel electrode branch 511 to the second pixel electrode branch 512, which are located in different pixel regions 80 and which are adjacent to each other in the extension direction of the corresponding one of the data lines 31. In this way, either of the first pixel electrode branch 511 and the second pixel electrode branch 512 is connected to the drain 73 of the corresponding one of the TFTs 70, and the first pixel electrode branch 511 and the second pixel electrode branch 512, which are located in different pixel regions 80 and which are adjacent to each other in the extension direction of the corresponding one of the data lines 31, may be connected to the same TFT 70. Setting the bridging portion 60 may not only reduce the number of the via holes, but also simplify the preparation process.

Furthermore, an orientation direction of the first pixel electrode branch 511 may be the same as that of the second pixel electrode branch 512. Alternatively, the orientation direction of the first pixel electrode branch 511 may be different from that of the second pixel electrode branch 512, and the first pixel electrode branch 511 and the second pixel electrode branch 512, which are located in different pixel regions 80 and which are adjacent to each other in the extension direction of the corresponding one of the data lines 31, are symmetrically arranged along an extension direction of the corresponding one of the scan lines 22. It can be understood that when the orientation direction of the first pixel electrode branch 511 is the same as that of the second pixel electrode branch 512, the pixel 90 is a single-domain structure. When the orientation direction of the first pixel electrode branch 511 is different from that of the second pixel electrode branch 512 and the first pixel electrode branch 511 and the second pixel electrode branch 512, which are located in different pixel regions 80 and which are adjacent to each other in the extension direction of the corresponding one of the data lines 31, are symmetrically arranged along an extension direction of the corresponding one of the scan lines 22, the pixel 90 is a dual-domain structure. That is, the type of the pixel 90 for the IPS display mode according to some embodiments of the present disclosure may be a single-domain pixel or a dual-domain pixel.

In this embodiment, the orientation direction of the first pixel electrode branch 511 is different from that of the second pixel electrode branch 512, and the first pixel electrode branch 511 and the second pixel electrode branch 512, which are located in different pixel regions 80 and which are adjacent to each other in the extension direction of the corresponding one of the data lines 31, are symmetrically arranged along an extension direction of the corresponding one of the scan lines 22. There are no specific restrictions on the orientation directions of the pixel electrode branches here, and the orientation directions of the pixel electrode branches may be selected according to actual needs.

The pixel common electrode 51 further includes a plurality of pixel electrode stems 513. Each of the plurality of pixel electrode stems 513 is connected to an end of a corresponding one of the plurality of pixel electrode branches 510 close to or adjacent to the corresponding one of scan lines 22. Each of the plurality of pixel electrode stems 513 is disposed along the extension direction of the corresponding one of the scan lines 22. Each of the pixel electrode stems 513 is configured to conduct or electrically connect the corresponding one of the plurality of pixel electrode branches 50. That is, the end of the first pixel electrode branch 511 close to the corresponding one of the scan lines 22 is connected to one of the pixel electrode stems 513, and the end of the second pixel electrode branch 512 close to the another corresponding one of the scan lines 22 is connected to another of the pixel electrode stems 513. It should be noted that the corresponding one of the scan lines 22 refers to one of the scan lines 22 closest to the first pixel electrode branch 511. Similarly, the another corresponding one of the scan lines 22 refers to another one of the scan lines 22 closest to the second pixel electrode branch 512.

It should be understood that in each of the plurality of the pixel region 80, an end of the first pixel electrode branch 511 close to the corresponding one of the metal common electrodes 21 may be connected to a corresponding one of the pixel electrode stems 513, and/or, an end of the second pixel electrode branch 512 close to the corresponding one of the metal common electrodes 21 may be connected to another corresponding one of the pixel electrode stems 513.

In some embodiments, each of two opposite ends of the first pixel electrode branch 511 is arranged with a corresponding one of the pixel electrode stems 513, and each of two opposite ends of the second pixel electrode branch 512 is arranged with another corresponding one of the pixel electrode stems 513. The one pixel electrode stem 513 which is arranged on one side of the first pixel electrode branch 511 close to the corresponding one of the scan lines 22 is connected to the bridging portion 60. The another pixel electrode stem 513 which is arranged on one side of the second pixel electrode branch 512 close to the another corresponding one of the scan lines 22 is connected to the bridging portion 60. In this way, the lead distance between the bridging portion 60 and the pixel electrode stems 513 will be reduced, and the impedance will be reduced, thereby reducing the voltage drop.

Furthermore, the second transparent conductive layer 50 may be arranged on one side of the first transparent conductive layer 40 away from the first substrate 10, or the second transparent conductive layer 50 may be arranged between the second metal layer 30 and the first metal layer 20. The position of the second transparent conductive layer 50 is related to the type of the TFTs 70. When the TFTs 70 are oxide TFTs, the second transparent conductive layer 50 is arranged on one side of the first transparent conductive layer 40 away from the first substrate 10. When the TFTs 70 are amorphous silicon TFTs, the second transparent conductive layer 50 is arranged between the second metal layer 30 and the first metal layer 20.

When the TFTs 70 are oxide TFTs and the second transparent conductive layer 50 is arranged on one side of the first transparent conductive layer 40 away from the first substrate 10, the array substrate 100 further includes a gate insulating layer (not shown), a semiconductor layer 74, a first insulating layer (not shown), a passivation layer (not shown), and a second insulating layer (not shown). The first metal layer 20, the gate insulating layer, the semiconductor layer 74, the second metal layer 30, the first insulating layer, the passivation layer, the first transparent conductive layer 40, the second insulating layer, and the second transparent conductive layer 50 are stacked sequentially on one side of the first substrate 10. The materials of the gate insulating layer, the first insulating layer, the second insulating layer, and the passivation layer are not limited here, and they may be selected according to the actual needs. Each metal common electrode 21 is connected to the common electrode layer 41 through a via hole, and the via hole passes through the gate insulating layer, the first insulating layer, and the passivation layer in sequence. The bridging portion 60 is connected to the drain 73 of each TFT 70 through a plurality of via holes, or the first pixel electrode branch 511 and the second pixel electrode branch 512 are connected to the drain 73 of each TFT 70 through the plurality of via holes. The plurality of via holes may be at least partially overlapped with each other in the direction substantially perpendicular to the first substrate 10, or the plurality of via holes may be arranged in a staggered manner. There are no limitations on a position of each via hole here, and it may be selected according to actual needs.

When the TFTs 70 are amorphous silicon TFTs and the second transparent conductive layer 50 is arranged between the second metal layer 30 and the first metal layer 20, the array substrate 100 further includes an amorphous silicon semiconductor layer (not shown) and the first insulating layer. The first metal layer 20, the amorphous silicon semiconductor layer, the first transparent conductive layer 40, the second metal layer 30, the first insulating layer, and the second transparent conductive layer 50 are stacked sequentially on one side of the first substrate 10. There is no insulating layer arranged between the pixel common electrode 51 and the drain 73 of each TFT 70, such that the pixel common electrode 51 may be directly connected to the drain 73 of each TFT. Each metal common electrode 21 is connected to the common electrode layer 41 through the via hole.

In this embodiment, the TFTs 70 are oxide TFTs and the second transparent conductive layer 50 is arranged on one side of the first transparent conductive layer 40 away from the first substrate 10. Each metal common electrode 21 and the common electrode layer 41 are connected through a plurality of first via holes 61. The first via holes 61 pass through the gate insulating layer, the first insulating layer, and the passivation layer in sequence. The number of the first via holes 61 is two or more. Each of the first via holes 61 is arranged close to the corresponding one of the data lines 31 and insulated from the corresponding one of the data lines 31. A cross sectional area of each metal common electrode 21 corresponding to each first via 61 is larger than or greater than that of other portions of each metal common electrode 21, so as to facilitate better connection between each metal common electrode 21 and the common electrode layer 41, and improve the conductivity between each metal common electrode 21 and the common electrode layer 41. The bridging portion 60 is connected to the drain 73 of each TFT 70 through a second via hole 62 and a third via hole 63 sequentially. The second via hole 62 passes through the second insulating layer, and the third via hole 63 passes through the passivation layer and the first insulating layer sequentially. In some embodiments, an orthographic projection of the second via hole 62 on the first substrate 10 is located in an orthographic projection of the third via hole 63 on the first substrate 10.

In this embodiment, the plurality of the pixel electrode branches 510 in each of the plurality of pixel regions 80 are divided into the first pixel electrode branch 511 and the second pixel electrode branch 512 by the corresponding one of the metal common electrodes 21. In the same pixel region 80, the end of the first pixel electrode branch 511 close to the corresponding one of the scan lines 22 is connected to the corresponding one of the TFTs 70, and the end of the second pixel electrode branch 512 close to the another corresponding one of the scan lines 22 is connected to the another corresponding one of the TFTs 70. In this way, the electrical signal transmitting through the corresponding one of the TFTs 70 is transmitted from the end of the first pixel electrode branch 511 close to the corresponding one of the scan lines 22 to an end of the first pixel electrode branch 511 away from the corresponding one of the scan lines 22. The electrical signal transmitting through the another corresponding one of the TFTs 70 is transmitted from the end of the second pixel electrode branch 512 close to the another corresponding one of the scan lines 22 to an end of the second pixel electrode branch 512 away from the another corresponding one of the scan lines 22. Thus, the transmission path of the electric signal on the plurality of pixel electrode branches 510 is effectively shortened, thereby reducing the attenuation of the electric signal on each pixel electrode branch 510 and improving the uniformity of the display brightness of the pixel 90.

Figure 4:
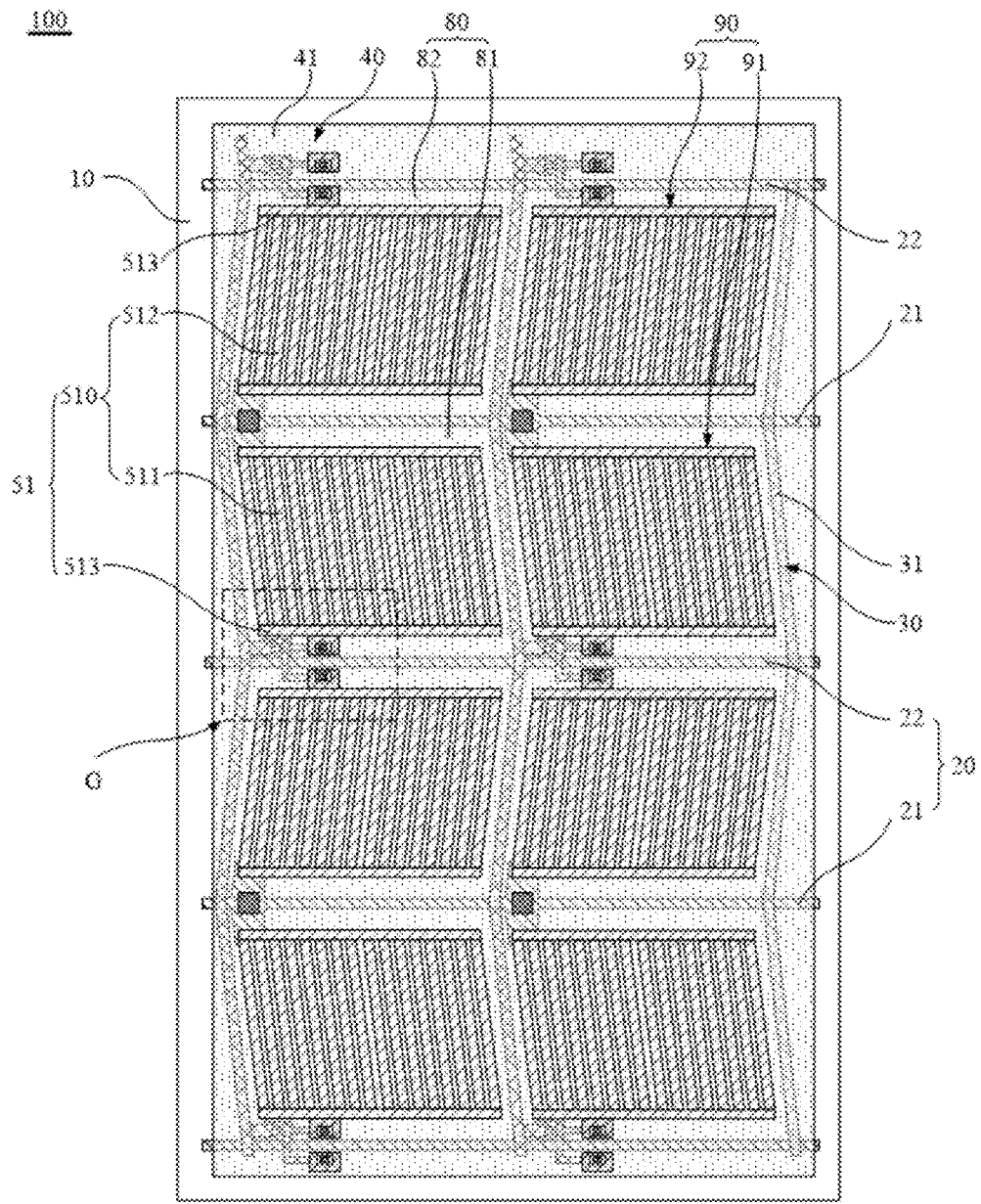
FIG. 4 is a schematic structural view of an array substrate according to some embodiments of the present disclosure.
Figure 5:
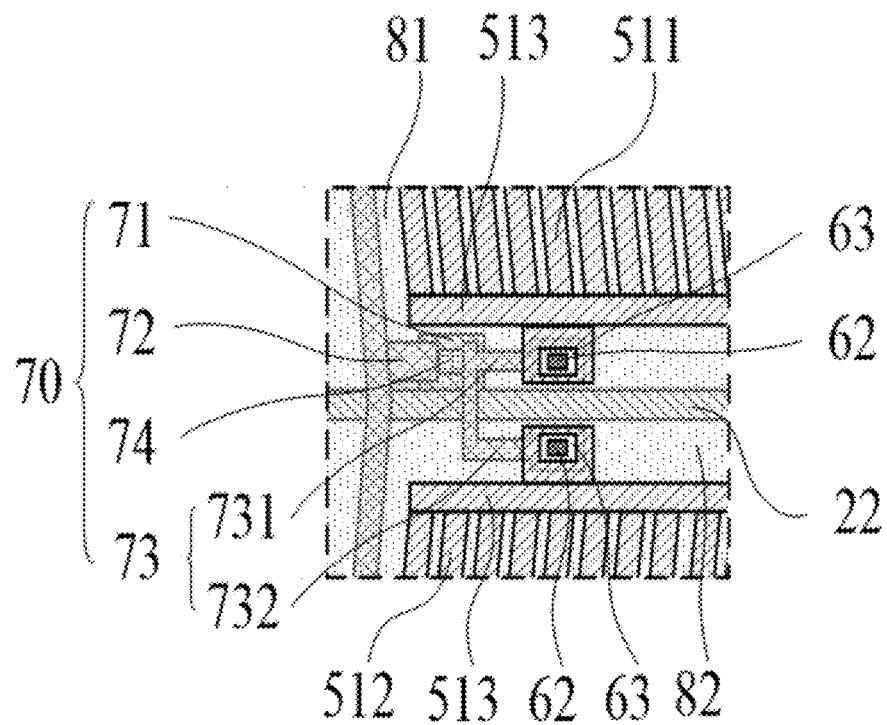
FIG. 5 is an enlarged structural schematic view of an area G circumscribed in FIG. 4 according to some embodiments of the present disclosure.

As shown in FIG. 1, FIG. 4 and FIG. 5, FIG. 4 is the structural schematic view of the second embodiment of the array substrate provided in the present disclosure, and FIG. 5 is an enlarged structural schematic view of an area G circumscribed in FIG. 4 according to some embodiments of the present disclosure.

The second embodiment of the array substrate 100 provided in the present disclosure is substantially the same in structure as the first embodiment of the array substrate 100. The difference is that each TFT 70 includes a pair of drains 73 in the second embodiment. In the extension direction of the corresponding one of the data lines 31, the first pixel electrode branch 511 and second pixel electrode branch 512, which are located in different pixel regions 80 and which are adjacent to each other, are respectively connected to different drains 73 of the same TFT 70.

In this embodiment, each TFT 70 includes the pair of drains 73. In the extension direction of the corresponding one of the data lines 31, the first pixel electrode branch 511 and the second pixel electrode branch 512 which are located in different pixel regions 80 and which are adjacent to each other, are respectively connected to the different drains 73 of the same TFT 70.

For the first pixel electrode branch 511 and the second pixel electrode branch 512 which are located in two adjacent of pixel regions 80 respectively and which are adjacent to each other, the end of the first pixel electrode branch 511 close to the corresponding one of the scan lines 22 is connected to one of the drains 73 of the corresponding one of the TFTs 70, and the end of the second pixel electrode branch 512 close to the corresponding one of the scan lines 22 is connected to the other of the drains 73 of the same TFT 70.

TFTs 70 are disposed on an intersection of the scan lines 22 and the data lines 31 and disposed in the corresponding one of the plurality of pixel regions 80. Each TFT 70 may include a first drain 731 and a second drain 732. The first drain 731 is connected to the first pixel electrode branch 511. The second drain 732 steps or extends across a corresponding one of the scan lines 22 and is connected to the second pixel electrode branch 512.

In this embodiment, each TFT 70 is located in the first area 81; for each TFT 70, the first drain 731 is located in the first area 81, and the second drain 732 extends across the corresponding one of the scan lines 22 and further extends to the second area 82. The pixel electrode stem 513 which is located at the end of the first pixel electrode branch 511 close to the corresponding one of the scan lines 22 is connected to the first drain 731 sequentially through a second via hole 62 and a third via hole 63. The pixel electrode stem 513 which is located at the end of the second pixel electrode branch 512 close to the corresponding one of the scan lines 22 is connected to the second drain 732 sequentially through another second via hole 62 and another third via hole 63. Herein, the first pixel electrode branch 511 and the second pixel electrode branch 512 in this embodiment are located in different pixel regions 80 and adjacent to each other, and the first drain 731 and the second drain 732 are in the same TFT.

It should be understood that each of the TFTs 70 may also be located in the second region 82; or a part of the each TFT 70 is located in the first area 81, and another part of the each of the TFTs 70 is located in the second area 82. In the same TFT 70, the position of the first drain 731 and the position of the second drain 732 may be interchanged. It is only necessary to ensure that each of the TFTs 70 includes the pair of drain 73, and the first pixel electrode branch 511 and the second pixel electrode branch 512, which are located in different pixel regions 80 and which are adjacent to each other, are connected to different drains 73 of the same TFT 70.

Compared with the first embodiment of array substrate 100 provided in the present disclosure, this design in the second embodiment may also reduce the attenuation of electrical signals on the plurality of the pixel electrode branches 510, thereby improving the uniformity of display brightness of the pixel 90. Besides, in this embodiment, each TFT 70 includes a pair of drains 73. The first pixel electrode branch 511 and the second pixel electrode branch 512, which are located in different pixel regions 80 and which are adjacent to each other, are respectively connected to different drains 73 of the same TFT 70. Compared with the first embodiment in which the first pixel electrode branch 511 and the second pixel electrode branch 512, which are located in different pixel regions 80 and which are adjacent to each other, are connected to the TFT 70 after stepping across the corresponding one of the scan lines 22 and being electrically connected to each other, this design in the second embodiment may reduce the generation of a parasitic capacitor.

Figure 6:
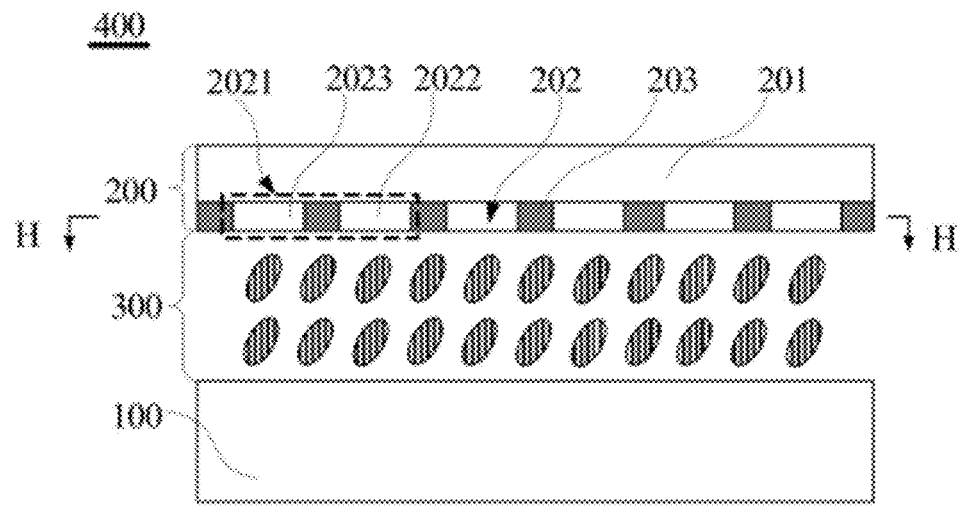
FIG. 6 is a structural schematic view of a display panel according to some embodiments of the present disclosure.
Figure 7:
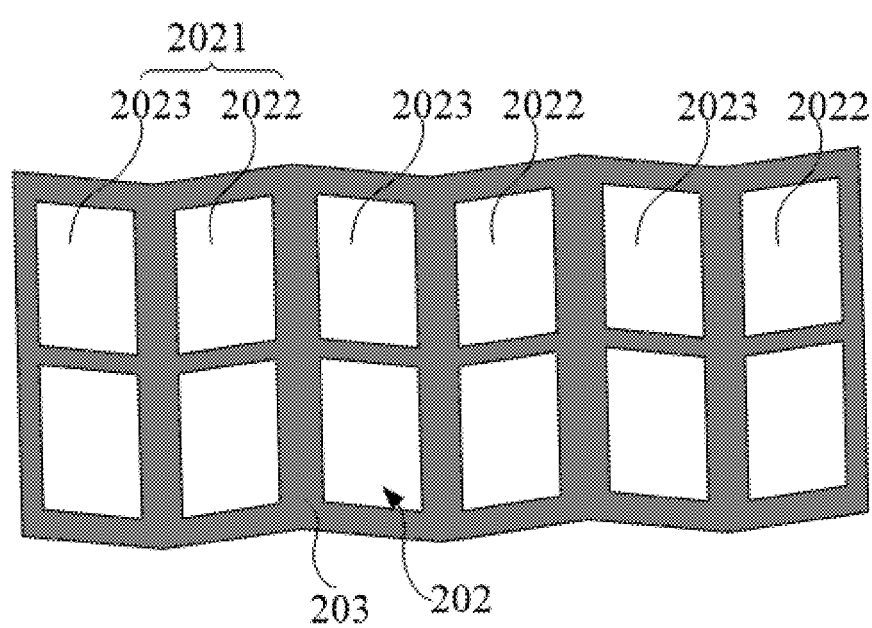
FIG. 7 is a structural schematic sectional view of the display panel along a line H-H in FIG. 6 according to some embodiments of the present disclosure.

As shown in FIG. 1, FIG. 6 and FIG. 7, FIG. 6 is a structural schematic view of a display panel according to some embodiments of the present disclosure, and FIG. 7 is a structural schematic sectional view of the display panel along a line H-H in FIG. 6 according to some embodiments of the present disclosure.

A display panel 400 is provided by some embodiments of the present disclosure. The display panel 400 includes an array substrate 100, a color film substrate 200, and a liquid crystal layer 300. The array substrate 100 may be the array substrate described in any of the above embodiments. The color film substrate 200 is arranged opposite to the array substrate 100. The liquid crystal layer 300 is arranged between the array substrate 100 and the color film substrate 200.

The color film substrate 200 includes a second substrate 201, a color resistance layer 202, and a light shielding layer 203. The color resistance layer 202 and the light shielding layer 203 are arranged on a side of the second substrate 201 close to the array substrate 100. The color resistance layer 202 is arranged correspondingly to and faces the pixel 90. The light shielding layer 203 is located on one side of the color resistance layer 202, and a projection of the light shielding layer 203 on the first substrate 10 covers a corresponding one of the metal common electrodes 21.

The color resistance layer 202 includes a plurality of color resistances 2021, and the plurality of color resistances 2021 correspond to the pixel 90 in one-to-one correspondence.

In this embodiment, each of the plurality of pixel regions 80 is divided into the first area 81 and the second area 82 by the corresponding one of the metal common electrodes 21 of the array substrate 100. The plurality of the pixel electrode branches 510 of the pixel 90 includes the first pixel electrode branch 511 and the second pixel electrode branch 512. That is to say, the pixel 90 in each of the plurality of pixel regions 80 is divided into two separated parts spaced apart from each other by the corresponding one of the metal common electrodes 21. The two separated parts are namely the first sub-pixel 91 and the second sub-pixel 92. The first sub-pixel 91 is located in the first region 81, and the second sub-pixel 92 is located in the second region 82. The plurality of color resistances 2021 include a first color resistance 2022 and a second color resistance 2023. The first color resistance 2022 is arranged correspondingly to or faces the first sub-pixel 91 in one-to-one correspondence, and the second color resistance 2023 is arranged correspondingly to or faces the second sub-pixel 92 in one-to-one correspondence. A space is defined between the first color resistance 2022 and the second color resistance 2023. The light shielding layer 203 is located in the space.

The projection of the light shielding layer 203 on the first substrate 10 also covers a via hole which is configured to conduct the corresponding one of the metal common electrodes 21 and the common electrode layer 41. The projection of the light shielding layer 203 on the first substrate 10 covers the corresponding one of the metal common electrodes 21 to obscure the abnormal display at the edge of the pixel 90. The light shielding light shielding 203 is located on a side of the color resistance layer 202 to reduce light crosstalk and improve the display effect.

In this embodiment, the light shielding layer 203 is a black matrix. The color resistance layer 202 and the light shielding layer 203 are located on the same horizontal layer. In other embodiments, the light shielding layer 203 may be made of other shading materials or metal materials, and the light shielding layer 203 and the color resistance layer 202 may also be located on different horizontal layers.

The above shows only embodiments of the present disclosure and does not limit the scope of the present disclosure. Any equivalent structure or equivalent process transformation performed based on the specification and accompanying drawings of the present disclosure, directly or indirectly applied in other related fields, shall be equivalently covered by the present disclosure.

What is claimed is:

1. An array substrate, comprising:
    a first substrate;
    a first metal layer, a second metal layer, and a first transparent conductive layer, wherein the first metal layer, the second metal layer, and the first transparent conductive layer are arranged on one side of the first substrate sequentially, wherein the first metal layer is configured to form metal common electrodes and scan lines, the second metal layer is configured to form data lines, the first transparent conductive layer is configured to form a common electrode layer, and the data lines are crossed with the scan lines to define a plurality of pixel regions, wherein each of the plurality of pixel regions comprises a pixel; and
    a second transparent conductive layer, configured to form a pixel common electrode of the pixel;
    wherein the pixel common electrode comprises a plurality of pixel electrode branches, and each of the plurality of pixel electrode branches extends along an extension direction of a corresponding one of the data lines; each metal common electrode is arranged between two adjacent of the scan lines, the plurality of pixel electrode branches in a corresponding one of the pixel regions are divided into a first pixel electrode branch and a second pixel electrode branch insulated from the first pixel electrode branch by a corresponding one of the metal common electrodes, and the first pixel electrode branch and the second pixel electrode branch, which are located in the same pixel region, are connected to different TFTs (thin film transistors);
    in the extension direction of the corresponding one of the data lines, the first pixel electrode branch and the second pixel electrode branch, which are located in different pixel regions and which are adjacent to each other, are connected to the same TFT; and an end of the first pixel electrode branch, which is close to one of the scan lines closest to the first pixel electrode branch, is connected to a corresponding one of the TFTs; and an end of the second pixel electrode branch, which is close to the one of the scan lines closest to the second pixel electrode branch, is connected to the corresponding one of the TFTs; so that in the same pixel region of the plurality of pixel regions, a transmission direction of an electric signal in the first pixel electrode branch is opposite to that in the second pixel electrode branch.

2. The array substrate according to claim 1, wherein in the extension direction of the corresponding one of the data lines, a color of the pixel in one of the pixel regions is the same as a color of the pixel in an adjacent one of the pixel regions.

3. The array substrate according to claim 1, wherein in the extension direction of the corresponding one of the data lines, the first pixel electrode branch and the second pixel electrode branch, which are located in different pixel regions and which are adjacent to each other, extend across a corresponding one of the scan lines and are electrically connected to each other.

4. The array substrate according to claim 3, further comprising a bridging portion configured to electrically connect the first pixel electrode branch and the second pixel electrode branch, which are located in different pixel regions and which are adjacent to each other in the extension direction of the corresponding one of the data lines;

wherein the bridging portion is partially overlapped with the corresponding one of the scan lines in a direction substantially perpendicular to the first substrate, and the bridging portion is connected to a corresponding one of the TFTS.

5. The array substrate according to claim 4, wherein each of the TFTs comprises one drain, the bridging portion is connected to the drain; and wherein the first pixel electrode branch and the second pixel electrode branch, which are located in different pixel regions and which are adjacent to each other in the extension direction of the corresponding one of the data lines, are respectively connected to the drain of the corresponding one of the TFTs through the bridging portion.

6. The array substrate according to claim 4, wherein the bridging portion is connected to a drain of each of the TFTs through a second via hole and a third via hole sequentially, and an orthographic projection of the second via hole on the first substrate is located in an orthographic projection of the third via hole on the first substrate.

7. The array substrate according to claim 1, wherein an orientation direction of the first pixel electrode branch is the same as that of the second pixel electrode branch; or the orientation direction of the first pixel electrode branch is different from that of the second pixel electrode branch, and the first pixel electrode branch and the second pixel electrode branch, which are located in different pixel regions and which are adjacent to each other in the extension direction of the corresponding one of the data lines, are symmetrically arranged along an extension direction of a corresponding one of the scan lines.

8. The array substrate according to claim 1, wherein the pixel common electrode further comprises a plurality of pixel electrode stems, and each of the plurality of pixel electrode stems is arranged along an extension direction of a corresponding one of the scan lines, and connected to an end of a corresponding one of the plurality of pixel electrode branches close to the corresponding one of the scan lines.

9. The array substrate according to claim 1, wherein the TFTs are oxide TFTs, and the second transparent conductive layer is arranged on one side of the first transparent conductive layer away from the first substrate; or the TFTs are amorphous silicon TFTs, and the second transparent conductive layer is arranged between the second metal layer and the first metal layer.

10. A display panel, comprising:
an array substrate, comprising:
   a first substrate;
   a first metal layer, a second metal layer, and a first transparent conductive layer, wherein the first metal layer, the second metal layer, and the first transparent conductive layer are arranged on one side of the first substrate sequentially, wherein the first metal layer is configured to form metal common electrodes and scan lines, the second metal layer is configured to form data lines, the first transparent conductive layer is configured to form a common electrode layer, and the data lines are crossed with the scan lines to define a plurality of pixel regions, wherein each of the plurality of pixel regions comprises a pixel; and
   a second transparent conductive layer, configured to form a pixel common electrode of the pixel;
   wherein the pixel common electrode comprises a plurality of pixel electrode branches, and each of the plurality of pixel electrode branches extends along an extension direction of a corresponding one of the data lines; each metal common electrode is arranged between two adjacent of the scan lines, the plurality of pixel electrode branches in a corresponding one of the pixel regions are divided into a first pixel electrode branch and a second pixel electrode branch insulated from the first pixel electrode branch by a corresponding one of the metal common electrodes, and the first pixel electrode branch and the second pixel electrode branch, which are located in the same pixel region, are connected to different TFTs;
   in the extension direction of the corresponding one of the data lines, the first pixel electrode branch and the second pixel electrode branch, which are located in different pixel regions and which are adjacent to each other, are connected to the same TFT; and
   an end of the first pixel electrode branch, which is close to one of the scan lines closest to the first pixel electrode branch, is connected to a corresponding one of the TFTs; and an end of the second pixel electrode branch, which is close to the one of the scan lines closest to the second pixel electrode branch, is connected to the corresponding one of the TFTs; so that in the same pixel region of the plurality of pixel regions, a transmission direction of an electric signal in the first pixel electrode branch is opposite to that in the second pixel electrode branch;
a color film substrate, arranged opposite to the array substrate; and
a liquid crystal layer, arranged between the array substrate and the color film substrate.

11. The display panel according to claim 10, wherein
the color film substrate comprises a second substrate, a color resistance layer, and a light shielding layer, wherein the color resistance layer and the light shielding layer are arranged on one side of the second substrate close to the array substrate, the color resistance layer corresponds to the pixel, the light shielding layer is arranged on a side of the color resistance layer, and a projection of the light shielding layer on the first substrate covers the corresponding one of the metal common electrodes.

12. The display panel according to claim 11, wherein the color resistance layer comprises a first color resistance and a second color resistance, and the light shielding layer is disposed between the first color resistance and the second color resistance.

13. The display panel according to claim 10, wherein
in the extension direction of the corresponding one of the data lines, a color of the pixel in one of the pixel regions is the same as a color of the pixel in an adjacent one of the pixel regions.

14. The display panel according to claim 10, wherein
in the extension direction of the corresponding one of the data lines, the first pixel electrode branch and the second pixel electrode branch, which are located in different pixel regions and which are adjacent to each other, extend across a corresponding one of the scan lines and are electrically connected to each other.

15. The display panel according to claim 14, wherein
the array substrate further comprises a bridging portion, and the bridging portion is configured to electrically connect the first pixel electrode branch and the second pixel electrode branch, which are located in different pixel regions and which are adjacent to each other in the extension direction of the corresponding one of the data lines;
wherein the bridging portion is partially overlapped with the corresponding one of the scan lines in a direction substantially perpendicular to the first substrate, and the bridging portion is connected to a corresponding one of the TFTS.

16. The display panel according to claim 15, wherein each of the TFTs comprises one drain, the bridging portion is connected to the drain; and
wherein the first pixel electrode branch and the second pixel electrode branch, which are located in different pixel regions and which are adjacent to each other in the extension direction of the corresponding one of the data lines, are respectively connected to the drain of the corresponding one of the TFTs through the bridging portion.

17. The display panel according to claim 15, wherein the bridging portion is connected to a drain of each of the TFTs through a second via hole and a third via hole sequentially, and an orthographic projection of the second via hole on the first substrate is located in an orthographic projection of the third via hole on the first substrate.

18. The display panel according to claim 10, wherein
an orientation direction of the first pixel electrode branch is the same as that of the second pixel electrode branch; or
the orientation direction of the first pixel electrode branch is different from that of the second pixel electrode branch, and the first pixel electrode branch and the second pixel electrode branch, which are located in different pixel regions and which are adjacent to each other in the extension direction of the corresponding one of the data lines, are symmetrically arranged along an extension direction of a corresponding one of the scan lines.

19. The display panel according to claim 10, wherein
the pixel common electrode further comprises a plurality of pixel electrode stems, and each of the plurality of pixel electrode stems is arranged along an extension direction of a corresponding one of the scan lines, and connected to an end of a corresponding one of the plurality of pixel electrode branches close to the corresponding one of the scan lines.

20. The display panel according to claim 10, wherein
the TFTs are oxide TFTs, and the second transparent conductive layer is arranged on one side of the first transparent conductive layer away from the first substrate; or
the TFTs are amorphous silicon TFTs, and the second transparent conductive layer is arranged between the second metal layer and the first metal layer.

* * * * *